(12) United States Patent
Matsumoto et al.

(10) Patent No.: US 9,390,972 B2
(45) Date of Patent: Jul. 12, 2016

(54) METHOD OF FABRICATING SEMICONDUCTOR DEVICE INCLUDING A SUBSTRATE HAVING COPPER INTERCONNECTS

(71) Applicant: TOKYO ELECTRON LIMITED, Tokyo (JP)

(72) Inventors: Kenji Matsumoto, Nirasaki (JP); Hiroaki Kawasaki, Nirasaki (JP); Hiroyuki Nagai, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 14/643,684

(22) Filed: Mar. 10, 2015

(65) Prior Publication Data

US 2015/0270166 A1    Sep. 24, 2015

(30) Foreign Application Priority Data

Mar. 18, 2014   (JP) .................................. 2014-055568

(51) Int. Cl.
*H01L 21/4763* (2006.01)
*H01L 21/768* (2006.01)

(52) U.S. Cl.
CPC .... *H01L 21/76883* (2013.01); *H01L 21/76832* (2013.01); *H01L 21/76834* (2013.01)

(58) Field of Classification Search
CPC ..................... H01L 21/76856; H01L 21/7684; H01L 21/7685
See application file for complete search history.

(56) References Cited

U.S. PATENT DOCUMENTS

| | | | | |
|---|---|---|---|---|
| 5,770,095 | A * | 6/1998 | Sasaki | C23F 3/00 216/103 |
| 2002/0155702 | A1* | 10/2002 | Aoki | H01L 21/02074 438/653 |
| 2011/0049718 | A1* | 3/2011 | Matsumoto | C23C 16/40 257/751 |
| 2012/0244698 | A1* | 9/2012 | Ryan | H01L 21/76834 438/653 |

FOREIGN PATENT DOCUMENTS

| | | |
|---|---|---|
| JP | 2009016520 A | 1/2009 |
| JP | 2011023456 A | 2/2011 |

* cited by examiner

*Primary Examiner* — Bradley K Smith
(74) *Attorney, Agent, or Firm* — Nath Goldberg & Meyer; Jerald L. Meyer

(57) ABSTRACT

A method of fabricating a semiconductor device including a substrate having a copper interconnect exposed on a surface of an insulation film, wherein a layer of an anti-corrosion agent composed of organic material is formed on the surface of the copper interconnect. The method includes removing the layer of the anti-corrosion agent by heating the substrate; and forming a thin layer including manganese oxide on the surface of the copper interconnect by supplying a gas containing an organic compound of manganese to the substrate.

5 Claims, 14 Drawing Sheets

METHOD OF FABRICATING SEMICONDUCTOR DEVICE INCLUDING A SUBSTRATE HAVING COPPER INTERCONNECTS

CROSS-REFERENCE TO RELATED APPLICATION

This application claims the benefit of priority to Japanese Patent Application No. 2014-055568, filed on Mar. 18, 2014, in the Japan Patent Office, the disclosure of which is incorporated herein in its entirety by reference.

TECHNICAL FIELD

The present disclosure relates to technology for forming a layer on surfaces of copper interconnects embedded in a depression formed on an insulation film.

BACKGROUND

In fabrication of a stack structure of copper interconnect layers in a semiconductor device through, for example, a dual damascene process, copper is embedded in a depression on an interlayer insulation film, copper residues are removed by chemical mechanical polishing (CMP), and a barrier layer is formed on a surface of a copper interconnect exposed on the interlayer insulation film and on a surface of the interlayer insulation film. The barrier layer serves to prevent diffusion of copper into the interlayer insulation film, and is composed of, for example, a SiCN layer formed of a compound of silicon (Si), carbon (C) and nitrogen (N), a SiC layer formed of a compound of silicon and carbon, or a SiN layer formed of a compound of silicon and nitrogen. In addition, the barrier layer also serves as an etching stopper in the case of stacking an interlayer insulation film of an upper layer on a surface of a substrate, followed by etching to form a depression on the interlayer insulation film.

Further, since the barrier layer has poor adhesion with copper, in order to improve reliability of interconnects through improvement of cohesion between the barrier layer and the copper interconnects, a method of forming a thin film between the barrier layer and the copper interconnects is known in the art. For example, a thin film of CoWP (cobalt-tungsten-phosphorous) or CoWB (cobalt-tungsten-boron) may be formed by electroless plating. However, CoWP or CoWB has high conductivity and provides a high possibility of short circuit between interconnects when attached to a surface of the interlayer insulation film. Moreover, the interlayer insulation film is likely to suffer from damage or metal contamination during the cleaning of the substrate after electroless plating. Further, a process of forming a manganese layer on copper interconnects is known. However, some processes of forming copper interconnects do not allow deposition of manganese oxide on a surface of the copper interconnect.

SUMMARY

Some embodiments of the present disclosure provide technology capable of forming a layer of manganese oxide on a surface of copper interconnects exposed on an insulation film.

According to one embodiment of the present disclosure, a method of fabricating a semiconductor device includes a substrate having a copper interconnect exposed on a surface of an insulation film, wherein a layer of an anti-corrosion agent composed of organic material is formed on the surface of the copper interconnect is disclosed. The method includes removing the layer of the anti-corrosion agent by heating the substrate; and forming a thin layer including manganese oxide on the surface of the copper interconnect by supplying a gas containing an organic compound of manganese to the substrate.

According to another embodiment of the present disclosure, the method includes forming a thin layer including manganese oxide on the surface of the copper interconnect by supplying gas containing organic compound of manganese and gas containing an oxidizing agent to the substrate.

BRIEF DESCRIPTION OF THE DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Figure 1:
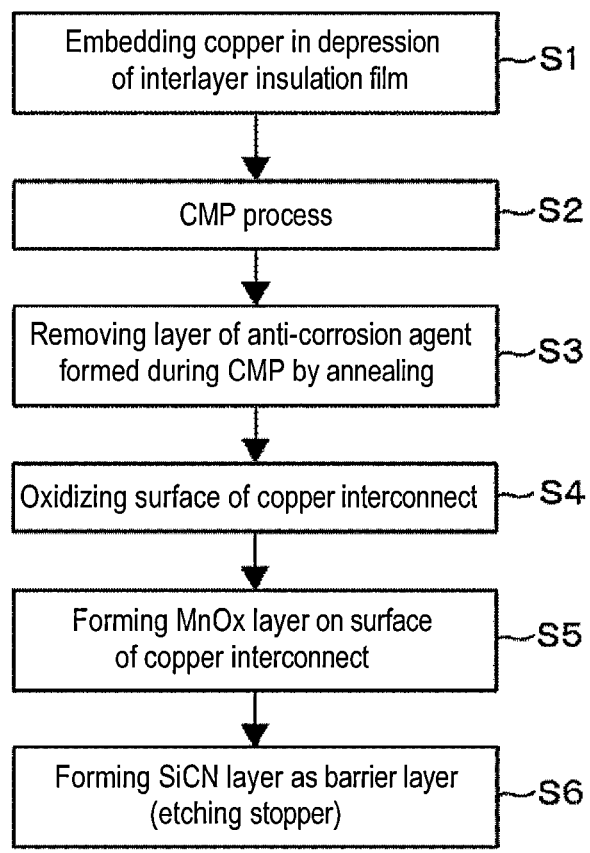
FIG. 1 is a flowchart of a method of fabricating a semiconductor device according to one embodiment of the present disclosure.
Figure 2:
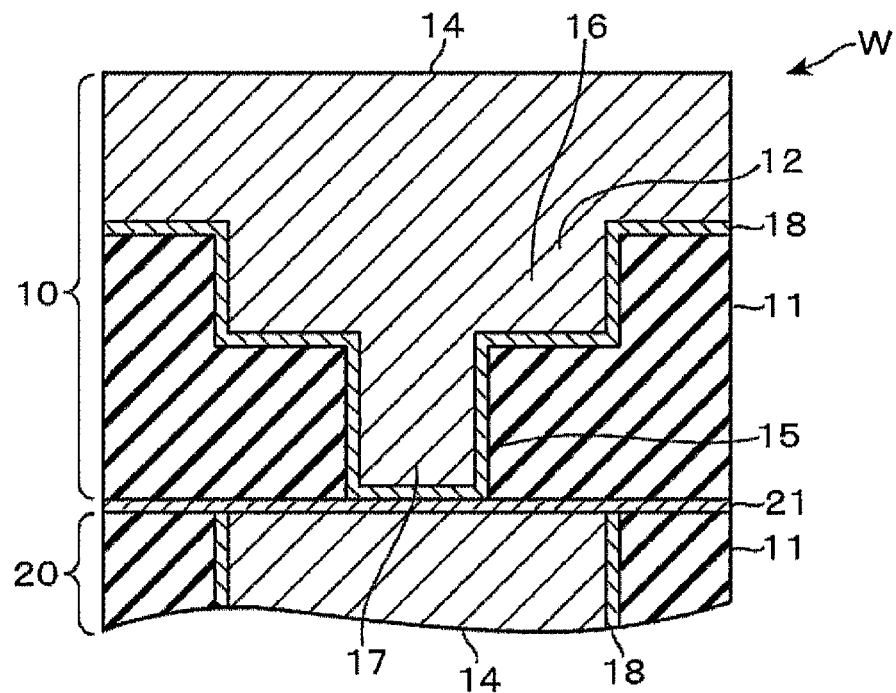
FIG. 2 is a process sectional view illustrating the method of fabricating a semiconductor device according to the embodiment of the present disclosure.

A method of fabricating a semiconductor device according to one embodiment of the present disclosure will be described with reference to FIGS. 1 to 8. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments. FIG. 1 is a flowchart of a method of fabricating a semiconductor device according to one embodiment of the present disclosure. In the embodiment of the present disclosure, first, copper for copper interconnects is embedded in a depression of an interlayer insulation film on a surface of a substrate, such as a semiconductor wafer (hereinafter, referred to as a [wafer]), by, for example, sputtering (Step S1). Referring to FIG. 2, a depression 12 is formed in an interlayer insulation film 11 with a first barrier layer 21 interposed between the interlayer insulation film 11 and a lower circuit section 20 at a lower layer side of a wafer W, and copper for copper interconnects 14 is embedded in the depression 12 with a metal barrier layer 18 interposed between the copper interconnect and the depression 12 to act as a second barrier layer. The depression 12 is composed of a trench 16 for embedding the copper interconnect 14 disposed in an upper circuit section 10 at an upper layer side of the wafer, and a via hole 17 for embedding a via 15 for interconnection between the copper interconnect 14 in the upper circuit section 10 and the copper interconnect 14 in the lower circuit section 20. Note that components of the lower circuit section 20 identical to those of the upper circuit section 10 are denoted by the same reference numerals.

The first barrier layer 21 serves to prevent copper of the copper interconnect 14 in the lower circuit section 20 from diffusing into the interlayer insulation film 11 at the upper layer side of the wafer, while acting as an etching stopper upon formation of the depression 12 by, for example, dry etching. The first barrier layer 21 is formed of, for example, SiCN, which is a compound of silicon, carbon and oxygen. Alternatively, the first barrier layer 12 may be formed of silicon carbide (SiC), silicon nitride (SiN), or the like.

The interlayer insulation film 11 is composed of, for example, a low dielectric layer, such as SiCOH, which is a compound of silicon, carbon, oxygen and hydrogen, and the like. The metal barrier layer 18 acting as the second barrier layer is formed between the copper interconnect 14 embedded in the depression 12 and the interlayer insulation film 11. The metal barrier layer 18 prevents copper of the copper interconnect 14 in the depression 12 from diffusing into the interlayer insulation film 11 and is formed of, for example, tantalum/tantalum nitride (Ta/TaN) and the like.

Figure 3:
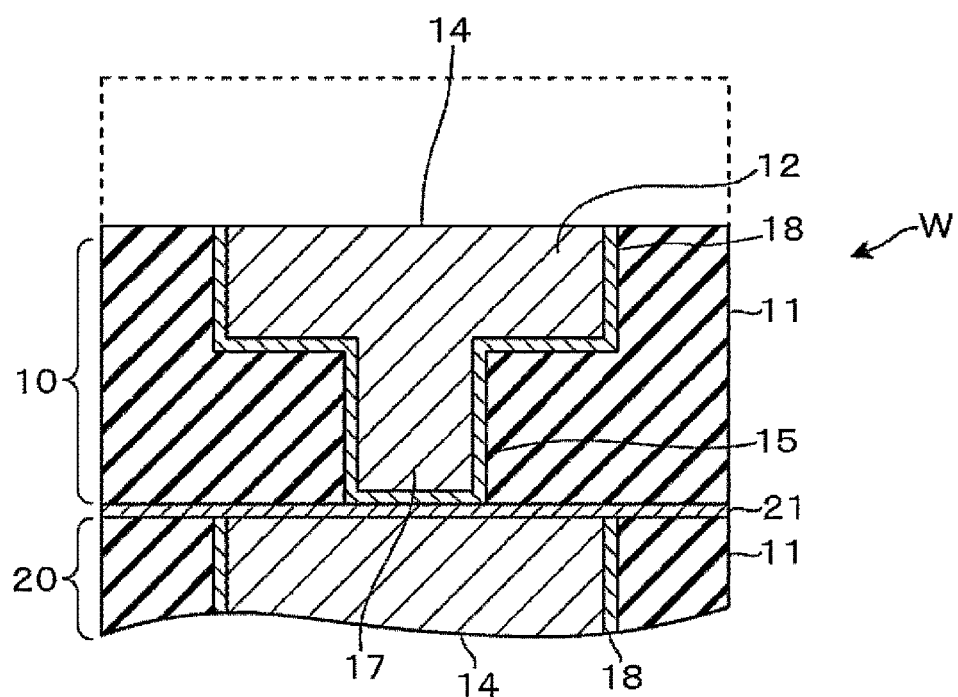
FIG. 3 is a process sectional view illustrating the method of fabricating a semiconductor device according to the embodiment of the present disclosure.
Figure 4:
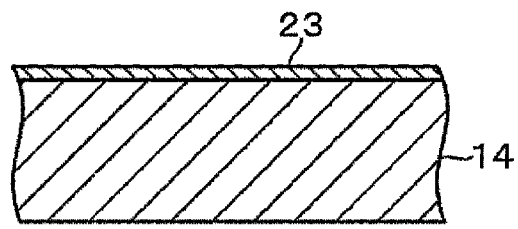
FIG. 4 is a process sectional view illustrating the method of fabricating a semiconductor device according to the embodiment of the present disclosure.

Referring to FIG. 3, the remaining copper interconnect 14 pushed out of the depression 12 and the metal barrier layer 18 formed on an upper surface of the interlayer insulation film 11 are removed by CMP (Step S2). The CMP is a process of polishing a surface of the wafer with a pad while supplying slurries including grinding grains. The surface of the wafer W is polished by chemical reaction and mechanical polishing to expose the copper interconnect 14 and the interlayer insulation film 11. The slurries contain an anti-corrosion agent, for example, benzotriazole (BTA, $C_6H_4N_3$), in order to prevent surface oxidation of the copper interconnect 14. Thus, as shown in FIG. 4, which is an enlarged sectional view of the surface of the copper interconnect 14, a hydrophobic thin layer 23 of the BTA is formed on the surface of the wafer W after the CMP.

Figure 5:
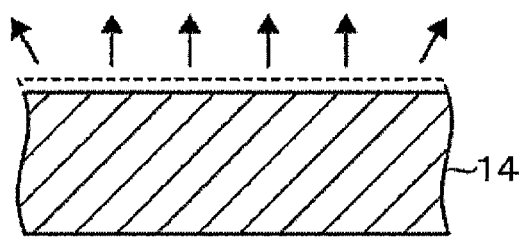
FIG. 5 is a process sectional view illustrating the method of fabricating a semiconductor device according to the embodiment of the present disclosure.

Next, referring to Step S3 of FIG. 1, annealing is performed by heating the wafer W at 300 degrees C. for 1200 seconds in an inert gas atmosphere, for example, in an argon (Ar) atmosphere under a vacuum or reduced pressure. As a result, as shown in FIG. 5, the thin layer 23 of the BTA formed on the surface of the wafer W is thermally decomposed and removed from the surface of the wafer W by scattering. Annealing may be performed under normal pressure without being limited to the vacuum or reduced pressure atmosphere, and the wafer W is heated to, for example, 300 degrees C. to 400 degrees C.

Figure 6:
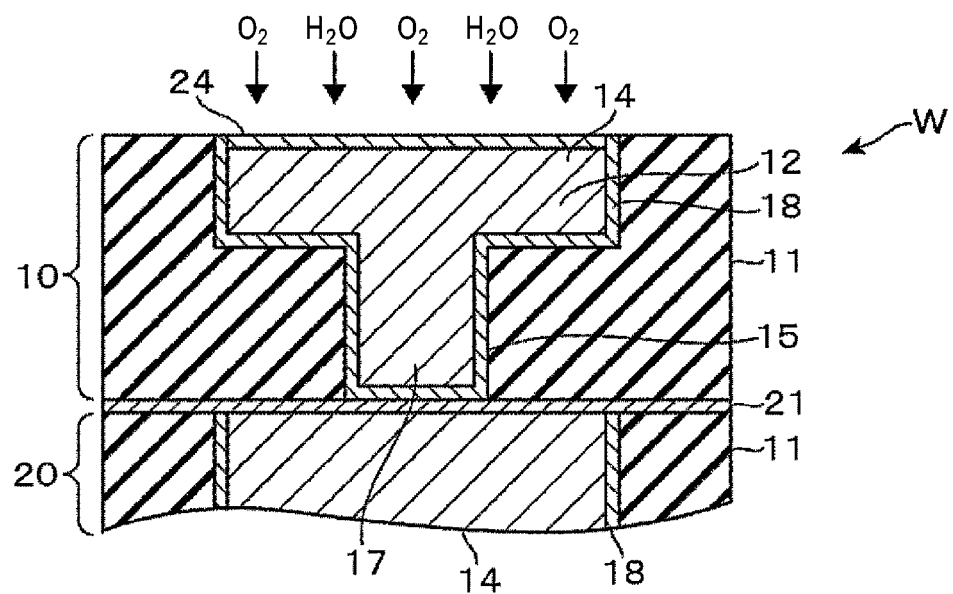
FIG. 6 is a process sectional view illustrating the method of fabricating a semiconductor device according to the embodiment of the present disclosure.

Then, a process of oxidizing the surface of the copper interconnect 14 is performed (Step S4). The oxidation process may be performed by, for example, leaving the wafer W in the air. For example, the wafer W is left in the air for four days. As shown in FIG. 6, since the thin layer 23 of BTA is removed from the surface of the wafer W, the surface of the copper interconnect 14 is oxidized by oxygen or vapor in the air to form a thin $CuO_x$ layer 24 thereon. Although CuO and $Cu_2O$ are known in the art as copper oxide, copper oxides including both components will be denoted by $CuO_x$ herein.

In Step S5, a layer of manganese oxide ($MnO_x$ (stoichiometric ratio of Mn to O not specified)) is formed on the surface of the copper interconnect 14 by, for example, atomic layer deposition (ALD). In the ALD, for example, with respect to the wafer W heated to a temperature of 100 to 250 degrees C., for example, 130 degrees C., in a vacuum atmosphere, supply of a raw material gas, that is, a Mn compound, and supply of an oxidizing gas, for example, are alternately performed plural times, for example, 20 times. A process of substituting the processing atmosphere with an inert gas, for example, nitrogen ($N_2$) gas is performed between the supply of the raw material gas and the supply of the oxidizing gas. For example, amideaminoalkane-based Mn compounds such as bis(N,N'-1-alkylamide-2-dialkylaminoalkane)manganese and the like is used as the raw material gas.

Figure 7:
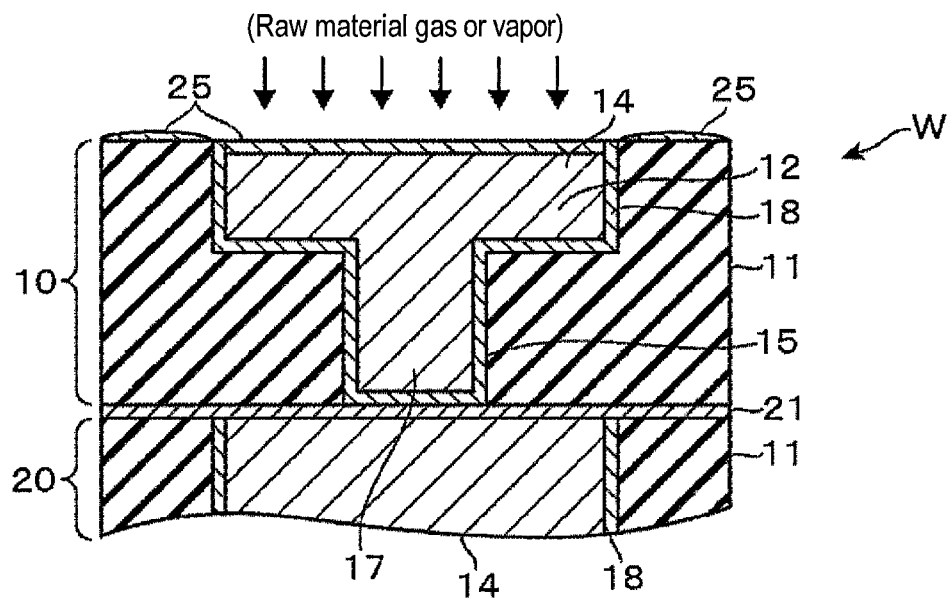
FIG. 7 is a process sectional view illustrating the method of fabricating a semiconductor device according to the embodiment of the present disclosure.

Through these series of processes, a layer of manganese oxide (thin film) 25 is formed on the surface of the copper interconnect 14, as shown in FIG. 7. The following is a supposed mechanism of forming the layer 25 of manganese oxide. When the raw material gas is supplied to the wafer W, the Mn compound is adsorbed to the surface of the wafer W. Part of the adsorbed Mn compound is decomposed into Mn on the surface of the $CuO_x$ layer 24 such that an atomic layer of Mn is formed on the surface of the copper interconnect 14. Then, a ligand of the Mn compound separated from Mn becomes a gas, which in turn is discharged outside.

Since a reducing gas such as $H_2$ and the like is not used as a supply gas in forming a layer by the manganese ALD, the $CuO_x$ layer 24 formed on the copper interconnect 14 is not reduced. As a result, when the manganese layer is formed on the surface of the copper interconnect 14, the $CuO_x$ layer 24 is reduced by Mn so that oxygen is interchanged with Mn. Accordingly, the layer 25 of manganese oxide is formed on the copper interconnect 14. Then, the supply of vapor as the oxidizing gas causes non-oxidized Mn or the adsorbed Mn compound residue to be oxidized by the vapor. In this way, the layer 25 of manganese oxide is stacked by repeating the supply of the raw material gas and the supply of the vapor. Further, through these series of processes, the layer 25 of manganese oxide is formed not only on the surface of the copper interconnect 14 but also on the surface of the interlayer insulation film 11.

In forming the layer of manganese oxide through the ALD, both the surface of the $CuO_x$ layer 24 and the surface of the interlayer insulation film 11 are subjected to incubation for a period of time of substantially zero. In a graph in which the horizontal axis indicates process time and the vertical axis indicates film thickness, the film formation on the interlayer insulation film 11 results in a vertical-intercept of substantially zero and the film formation on the $CuO_x$ layer 24 results in an increased vertical-intercept. Further, the rate of forming the layer of manganese oxide is much faster on the surface of the $CuO_x$ layer 24 than on the interlayer insulation film 11. Accordingly, it can be considered that the manganese oxide is selectively formed on the surface of the copper interconnect 14.

Figure 8:
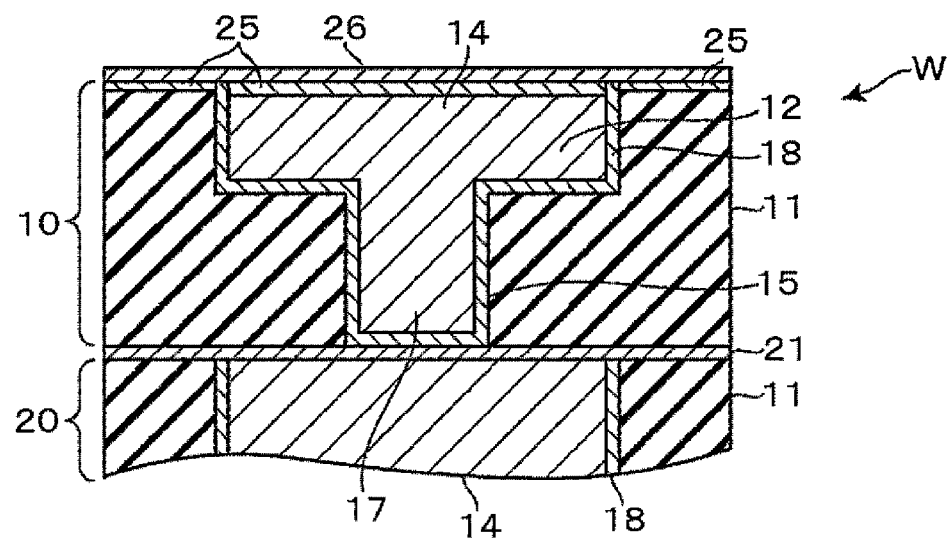
FIG. 8 is a process sectional view illustrating the method of fabricating a semiconductor device according to the embodiment of the present disclosure.

After formation of the layer 25 of manganese oxide on the surface of the copper interconnect 14, for example, a SiCN layer 26 acting as both the barrier layer and the etching stopper described above is formed on the overall surface of the wafer W by chemical vapor deposition (CVD), as shown in FIG. 8 (Step S6). Then, the interlayer insulation film 11 is stacked on the SiCN layer 26, thereby forming an interconnect structure at an upper layer side.

Further, as the Mn compound, cyclopentadienyl-based Mn compound gas (represented by $Mn(RC_5H_4)$), carbonyl-based Mn compound gas, beta-diketone-based Mn compound gas, amidinate-based Mn compound gas (represented by $Mn(R^1N$—$CR^3NR^2)_2$), and amideaminoalkane-based Mn compound gas (represented by $Mn(R_1N$—$Z$—$NR^2{}_2)_2$) can be used. The R, $R^1$, $R^2$ and $R^3$ are functional groups represented by —$C_nH_{2n-1}$ (n being an integer of 0 or more), and the Z is a functional group represented by —$C_nH_{2n}$— (n being an integer of 1 or more).

In the above embodiment, the CMP using the slurries containing the anti-corrosion agent has been described as an example of forming the thin film 23 of the anti-corrosion agent on the surface of the wafer W (the surface of the copper interconnect 14). However, in addition to such an example, the present disclosure may also be applied to an example wherein the CMP is performed using slurries not containing the anti-corrosion agent, followed by cleaning the wafer W with a cleaning solution containing the anti-corrosion agent to form the thin layer 23 of the anti-corrosion agent, for example, the BTA, on the surface of the wafer W.

The aforementioned embodiment perceived the fact that, upon removal of copper residues deposited on the surface of the interlayer insulation film 11 by the CMP, the BTA contained in the slurries used for the CMP or in the post-cleaning solution is attached to the surface of the copper interconnect 14 so that the thin layer 23 of the BTA obstructs the deposition of the manganese oxide on the surface of the copper interconnect 14. As such, the wafer W is subjected to annealing to allow removal of the BTA from the surface of the copper interconnect 14 through scattering, the surface of the copper interconnect 14 is oxidized in the air, and then the manganese ALD is performed for the wafer W, whereby the layer 25 of manganese oxide is formed on the surface of the copper interconnect 14.

As a result, through subsequent film formation processing, the SiCN layer 26 is formed in a closely contact state on the surface of the copper interconnect 14, with the layer 25 of manganese oxide interposed therebetween. In addition, since copper oxides present in the copper interconnect 14 are reduced during the formation of the manganese oxide, there is no negative influence such as increase in resistance of the copper interconnect 14. Further, since the surface of the copper interconnect 14 is covered with the layer 25 of manganese oxide, electron migration can be suppressed. Consequently, high reliability is secured with respect to the copper interconnect 14.

Further, although a method of directly forming the bather layer such as the SiCN layer on the copper interconnect 14 without using the anti-corrosion agent in the CMP slurries or the post-cleaning solution was considered, this method requires managing time until the wafer is transported into an apparatus for forming the barrier layer or managing the atmosphere around the wafer W, in order to suppress natural oxidation of the surface of the copper interconnect 14 after completion of the CMP. On the contrary, the method according to said embodiment does not have constraints in operation, such as the time management or the atmosphere management, and is thus advantageous.

Further, the layer 25 of manganese oxide may be formed by the CVD. For example, a raw material and a trace of vapor may be simultaneously supplied to a wafer W by a decompressed CVD apparatus known in the art to form the layer 25 of manganese oxide. Further, instead of the vapor, oxygen gas or ozone gas as well as $CO_2$, $NO_x$ ($N_2O$, $NO$, $NO_2$), or dry air, may be supplied as the oxidizing gas.

The present disclosure is not limited to the embodiment wherein oxidation processing is performed before formation of the layer 25 of manganese oxide after removing the anti-corrosion agent. Upon formation of the layer 25 of manganese oxide through the manganese ALD or the CVD, the surface of the copper interconnect 14 is oxidized by the oxidizing gas to form a $CuO_x$ layer 24. As a result, even in the case where oxidation processing is not performed before formation of the layer 25 of manganese oxide, it is possible to form the layer 25 of manganese oxide on the surface of the copper interconnect 14. In order to oxidize the copper interconnect 14, oxidation processing may be performed before formation of the layer 25 of manganese oxide, and the surface of the copper interconnect 14 may be oxidized upon formation of the layer 25 of manganese oxide.

Further, in the present disclosure, the layer 25 of manganese oxide may be formed on the wafer W not using an anti-corrosion agent in the CMP or the post-cleaning process. In this case, since the thin layer 23 of the anti-corrosion agent is not formed on the surface of the copper interconnect 14, oxidation processing is performed with respect to the surface of the copper interconnect 14 without annealing. For this processing, the surface of the wafer W may be subjected to aeration in the air, oxidation processing with an oxidizing gas used in formation of the layer 25 of manganese oxide, and the like, as described above.

Next, a semiconductor fabrication system performing the method for fabricating a semiconductor device described above will be described. The semiconductor fabrication system includes, for example, a CMP apparatus, an annealing apparatus, an ALD apparatus 5, and a vacuum process apparatus provided with an apparatus for forming a SiCN layer.

The CMP apparatus supplies slurries containing an anti-corrosion agent, for example, BTA, to the surface of a wafer W, and flattens a target surface of a wafer W through chemical reaction and mechanical polishing by compressing the wafer W while rotating a polishing pad.

Figure 9:
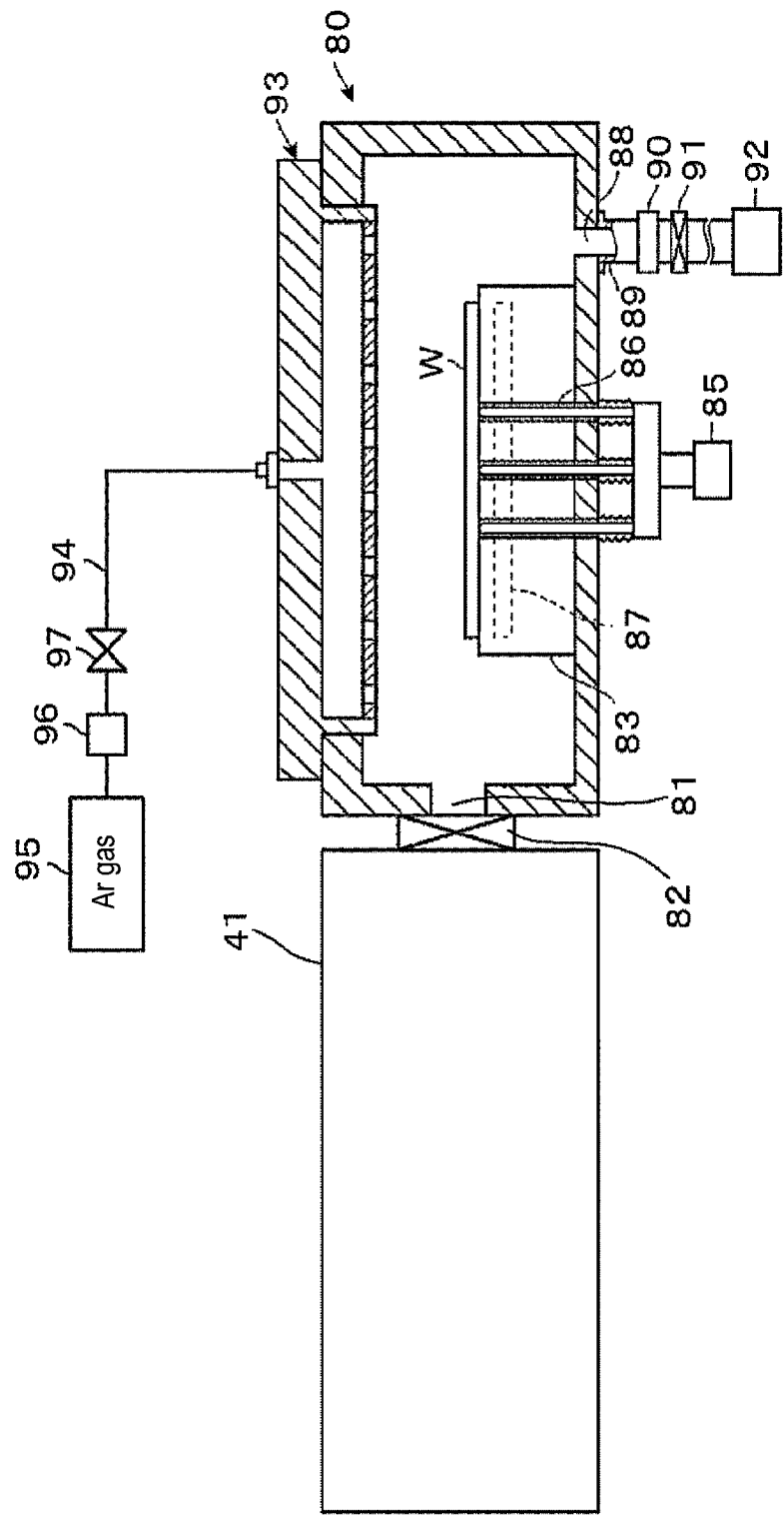
FIG. 9 is a partial side sectional-view of an annealing apparatus.

Referring to FIG. 9, in the annealing apparatus, a stage 83 on which the wafer W will be loaded is disposed within a process container 80, which is a vacuum chamber, and is provided with push-up pins 86 that extend through the process container 80 to be raised above an upper surface of the stage 83 by a lift mechanism 85 and allow the wafer W to be loaded thereon.

The stage 83 is provided therein with a heater 87 constituting a heating unit to heat the wafer W to a preset temperature. The process container 80 is provided at a lower side thereof with an exhaust port 88, to which a vacuum pump 92 is connected via an exhaust pipe 89, with a pressure regulator 90 interposed therebetween. Reference numeral 91 indicates a valve.

The process container 80 is provided at an upper side thereof with a shower head 93, which is an inert gas supply for supplying inert gas, for example, Ar gas. The shower head 93 is connected to a downstream lower end of an inert gas supply pipe 94, to which an inert gas source 95, a flow rate regulator 96, and a valve 97 are sequentially provided at an upstream side, such that inert gas can be supplied to the process container 80. A load lock chamber 41 is connected to an entrance/exit gate 81 of the process container 80, with a gate valve 82 interposed therebetween.

Figure 10:
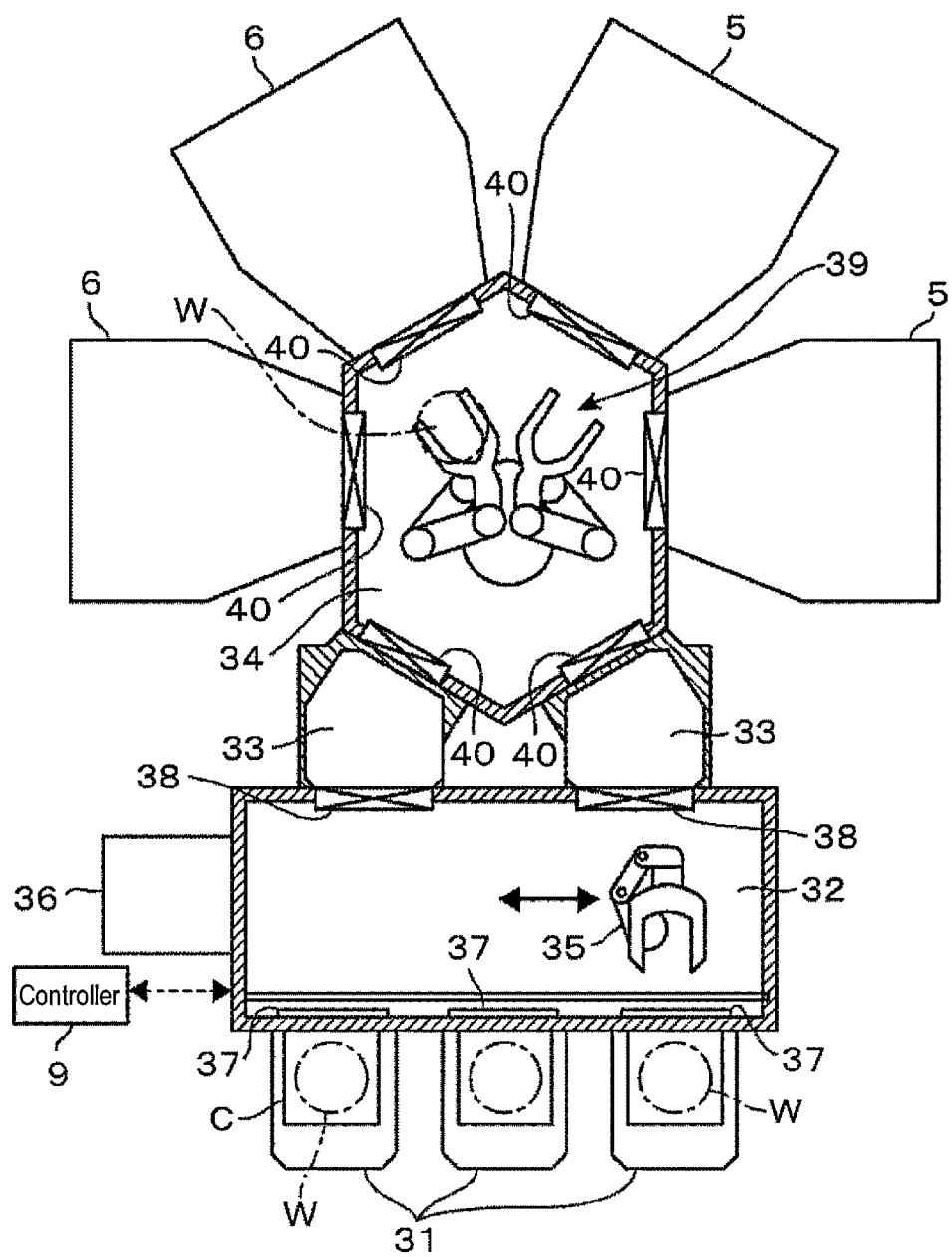
FIG. 10 is a plan view of a semiconductor fabrication apparatus according to one embodiment of the present disclosure, partially showing a cross-section of the semiconductor fabrication apparatus.

Referring to FIG. 10, the vacuum process apparatus is provided with an elongated normal pressure transport chamber 32 that extends in the longitudinal direction and becomes a normal pressure atmosphere by, for example, $N_2$ gas. Load ports 31 are disposed at a front side of the normal pressure transport chamber 32 to transport and receive wafers W with respect to, for example, transport containers C for carrying the wafers W.

The normal pressure transport chamber 32 is provided at a front wall thereof with a door 37 that is opened or closed together with covers (not shown) provided to the transport containers C. In the normal pressure transport chamber 32, a first transport arm 35, which is comprised of articulated arms, is disposed to transport the wafers W. In addition, when viewed from the load ports 31 of the normal pressure transport chamber 32, an alignment chamber 36 adjusting a direction or bias of the wafers W is installed at a left wall. Further, the normal pressure transport chamber 32 is provided at a lower side thereof with an exhaust port for discharging air from the normal pressure transport chamber 32 through exhaust means including an exhaust fan and the like.

The normal pressure transport chamber 32 is provided at the opposite side of the load ports 31 with, for example, two load lock chambers 33, which are arranged at right and left sides and convert an interior atmosphere between a normal pressure atmosphere and a vacuum atmosphere, with the wafers W in a standby state therein, and are each partitioned from the normal pressure transport chamber 32 by door valves 38. The first transport arm 35 serves to receive and transport the wafers W with respect to the transport containers C, the alignment chamber 36, and the load lock chambers 33. When viewed from the normal pressure transport chamber 32 of the load lock chamber 33, a vacuum transport chamber 34 is disposed at an inner side with gate valves 40 interposed therebetween.

In the vacuum transport chamber 34, the load lock chambers 33, the ALD apparatus 5, and a decompressed CVD apparatus 6, which corresponds to an apparatus for forming a SiCN layer, are installed with the gate valves 40 interposed therebetween. The vacuum transport chamber 34 is provided with a second transport arm 39, by which the wafers are transported between the vacuum transport chamber 34 and each of the load lock chamber 33, the ALD apparatus 5, and the decompressed CVD apparatus 6. The vacuum transport chamber 34 is provided, for example, at a lower side thereof with an exhaust pipe to be connected to a vacuum exhaust mechanism, and is evacuated such that a nitrogen atmosphere is generated therein by a nitrogen supply mechanism. The decompressed CVD apparatus 6 may be, for example, a well-known decompressed CVD apparatus.

Figure 11:
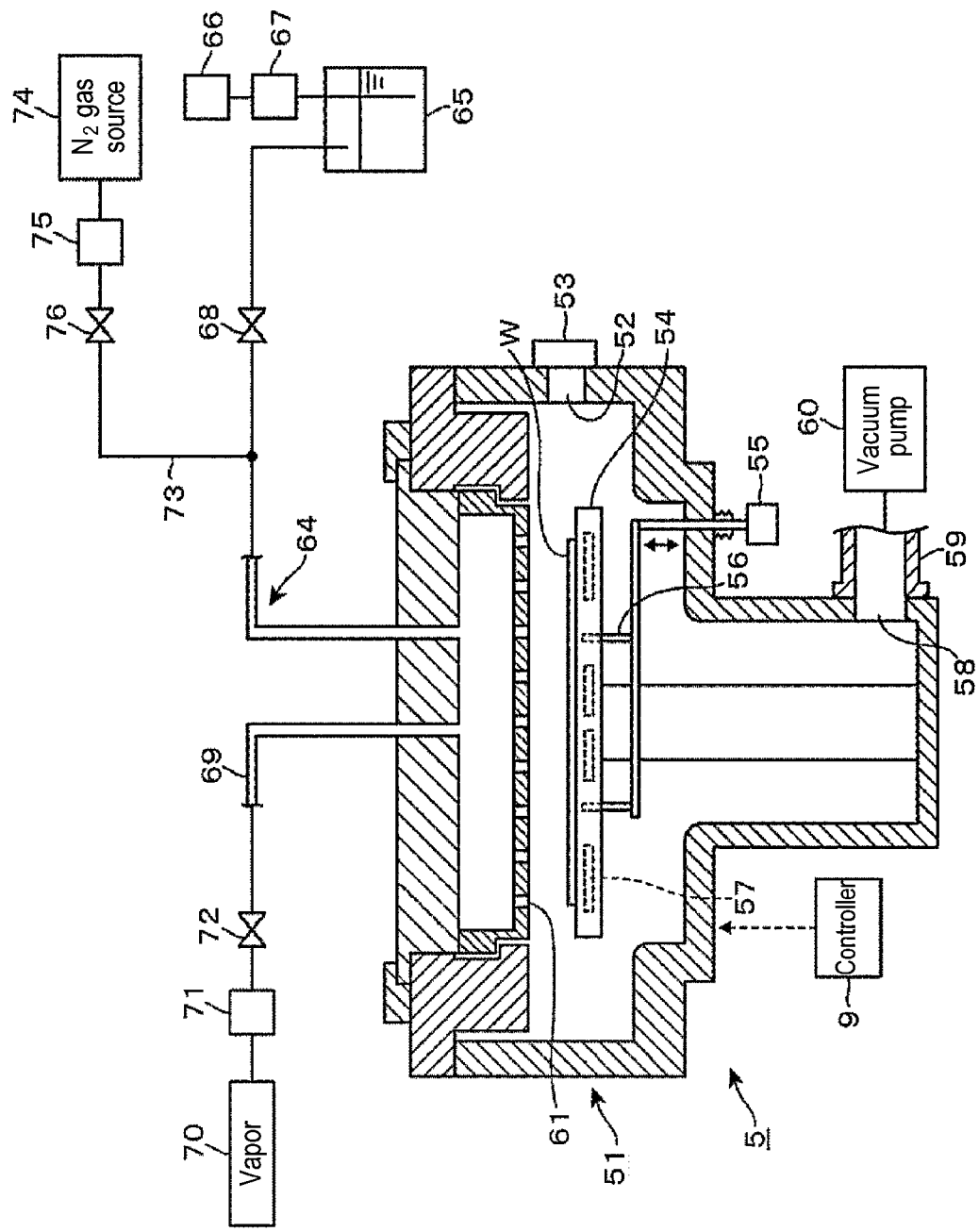
FIG. 11 is a longitudinal sectional-view of an ALD apparatus.

Referring to FIG. 11, the ALD apparatus 5 includes a mushroom-shaped process container 51, which is a vacuum chamber. The process container 51 is provided at one side thereof with an entrance/exit gate 52 for delivery of wafers W, and the entrance/exit gate 52 is provided with a gate valve 53 for opening and closing the entrance/exit gate 52.

The process container 51 includes a cylindrical stage 54 on which wafers will be loaded. In addition, the stage 54 is provided with three push-up pins 56 arranged at constant intervals from one another in the circumferential direction of the stage 54 to be lifted above an upper surface of the stage 54 by a lifter 55.

The stage 54 includes a heater 57, disposed therein to constitute a heating unit that heats the wafer W loaded on the stage 54 to the preset temperature. An exhaust port 58 is formed at a lower surface of the process container 51. The exhaust port 58 is connected to a vacuum pump 60, which is a vacuum exhaust mechanism, via an exhaust pipe 59.

The process container 51 is provided at an upper side thereof with a gas shower head 61, which constitutes a gas supply unit and is connected to a downstream end of a raw material gas supply pipe 64. An upstream side of the raw material gas supply pipe 64 is connected to a raw material reservoir 65. The raw material reservoir 65 stores amideaminoalkane-based Mn compounds, for example, bis(N,N'-1-alkylamide-2-dialkylaminoalkane)manganese, which is heated to 80 degrees C. to 90 degrees C. by a heater (not shown) and stored in a liquid state. Further, the raw material reservoir 65 is connected to a bubbling gas supply 66 such that the raw material stored in the raw material reservoir 65 is subjected to bubbling by nitrogen gas and the like (for example, at a flow rate of 50 sccm) supplied from the bubbling gas supply 66.

Furthermore, in FIG. 11, reference numeral 67 indicates a flow rate regulator for regulating the flow rate of the bubbling gas and reference numeral 68 indicates a valve. The raw material gas supply pipe 64 is connected at a downstream side of the valve 68 to a downstream end of a nitrogen ($N_2$) gas supply pipe 73, to which an $N_2$ gas source 74, a flow rate regulator 75, and a valve 76 are sequentially connected in this order from an upstream side.

Further, the gas shower head 61 is connected to a vapor supply pipe 69 through which vapor for generating manganese oxide is introduced (for example, at a flow rate of 1 sccm). A vapor source 70, a flow rate regulator 71, and a valve 72 are sequentially connected to the vapor supply pipe 69 from an upstream side. Further, in order to prevent the raw material gas vaporized by bubbling from cooling to solid or liquid, the process container 51, the gas shower head 61, the raw material gas supply pipe 64, and the valve 68 are heated to about 80 degrees C. to 100 degrees C. by a heater (not shown). Further, in order to prevent vapor from cooling to liquid, the vapor supply pipe 69, the vapor source 70, the flow rate regulator 71, and the valve 72 are heated to about 40 degrees C. to 60 degrees C. by the heater (not shown).

Each of the semiconductor fabrication apparatus, the annealing apparatus and the CMP apparatus includes a controller 9, which is also connected to a supervisory computer. The controller 9 is composed of, for example, a computer, and includes a program, a memory, and a CPU. The program is composed of step groups to implement a series of operations in the process of fabricating a semiconductor device as described above, whereby opening/closing of the respective valves, regulation of the flow rates of the gas, and adjustment of the pressure in the process container are performed according to the program. The programs are installed in the controller 9 through a computer-readable storage medium such as a flexible disk, a compact disc, a hard disk, a magneto-optical disc, and the like. In addition, transport between the respective apparatuses is performed by controlling an automatic transport mechanism for automatically delivering the transport containers C configured to transport wafers by the supervisory computer.

Next, a process of a wafer W in the semiconductor fabrication system will be described hereinafter. The wafer W is subjected to polishing with slurries containing the BTA by the CMP apparatus (or subjected to polishing with slurries by the CMP apparatus and cleaning with a cleaning agent containing the BTA), and is then transported into the annealing apparatus. In the annealing apparatus, the wafer is loaded on the stage 83 and heated to a preset temperature, for example, 300 degrees C., by the heater 87 of the stage 83. In addition, the valve 97 is opened to supply an inert gas into the process container 80, while the process container 80 is evacuated to a predetermined pressure by the vacuum pump 92. The wafer W is heated, for example, for 1200 seconds to remove the thin layer 23 of the BTA formed on the surface of the wafer W during the CMP.

The wafer W taken out of the annealing apparatus, for example, is left in the transport container C for 4 days. As a result, the surface of the copper interconnect 14 is oxidized by the air in the transport container C. Thereafter, the transport container C is delivered into the load port 31 of the vacuum process apparatus by the automatic transport mechanism, such as OHT (Overhead Hoist Transport) and the like. Then, the wafer W is taken out of the transport container C and is delivered into the alignment chamber 36 through the normal pressure transport chamber 32 to perform alignment. Then, the wafer W is transported into the vacuum transport chamber 34 through the load lock chamber 33, and is transported into the ALD apparatus 5 by the second transport arm 39.

After the wafer W is loaded on the stage 54, the process container 51 is evacuated to a predetermined pressure by the vacuum pump 60, and the wafer W is heated to 130 degrees C. by the heater 57 provided to the stage 54. In addition, bubbling gas is supplied to the raw material reservoir 65. A raw material is vaporized by bubbling, and a cycle of supply of raw material→substitution by $N_2$ gas→supply of vapor→substitution of process atmosphere by $N_2$ gas is repeated 20 times through manipulation of the gas valves 68, 72, 76. Through this process, the aforementioned layer 25 of manganese oxide is formed on the wafer W.

Thereafter, the wafer W is delivered into the decompressed CVD apparatus 6 in which a SiCN layer 26 is formed to cover the surfaces of the layer 25 of manganese oxide and the interlayer insulation film 11. After the formation of the SiCN layer 26, the wafer W is taken out of the decompressed CVD apparatus 6, sequentially delivered to the vacuum transport chamber 34→the load lock chamber 33→the normal pressure transport chamber, and returned to the corresponding transport container C.

In the present disclosure, the vacuum process apparatus may be connected to the annealing apparatus and the ALD apparatus. For example, the wafer W subjected to the CMP may be delivered into the semiconductor fabrication apparatus to perform annealing, and then returned to the corresponding transport container C. The wafer W may be exposed in the air to oxidize the surface of the copper interconnect 14, and then delivered into the semiconductor fabrication apparatus to form the layer 25 of manganese oxide.

Further, the vacuum transport chamber 34 of the vacuum process apparatus shown in FIG. 10 may be connected to the annealing apparatus, the ALD apparatus 5, the decompressed CVD apparatus 6, and an oxidation apparatus for oxidation of copper interconnects. For example, the oxidation apparatus is configured to supply oxidizing gas towards the wafer W while heating the wafer W placed in the vacuum container. In this case, the wafer W delivered to the vacuum process apparatus is sequentially transported, for example, through the annealing apparatus→the oxidation apparatus→the ALD apparatus 5, and is subjected to processing.

EXAMPLES

Examples according to the present disclosure will be described to verify effects of the embodiments according to the present disclosure.

Example 1

A substrate having a Cu layer oxidized by the air formed on a surface thereof, and a substrate having an insulation film of SiCOH formed on a surface thereof were prepared, followed by formation of a thin layer of manganese oxide on each of the substrates by the ALD described in the embodiments of the present disclosure. Then, the thickness of the thin layer of manganese oxide was measured. For the Cu layer and the insulation film, film formation temperature through the ALD was respectively set to 130 degrees C. or at 230 degrees C., the numbers of cycles for the ALD were set to 2, 5, 10, 20, and 30 cycles, and the film thickness was measured using a fluorescent X-ray analyzer.

Figure 12:
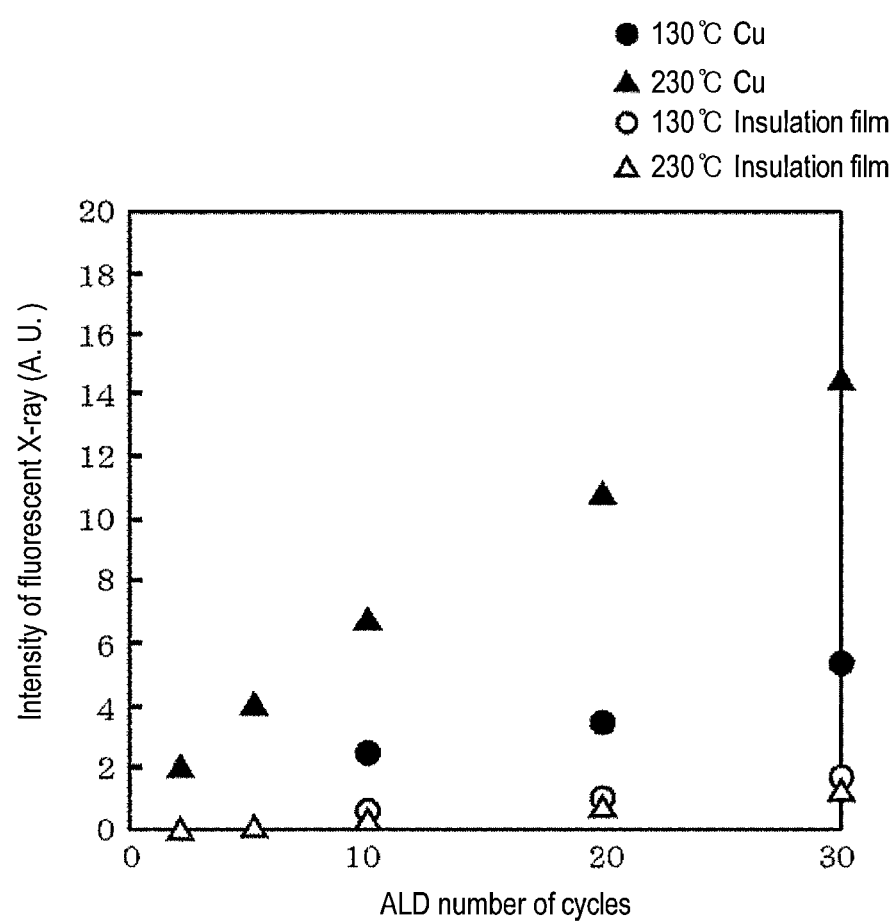
FIG. 12 is a graph depicting a relationship between the number of cycles for ALD and thickness of a layer of manganese oxide.

FIG. 12 shows analysis results and is a graph depicting values (intensity of fluorescent X-ray) corresponding to layer thickness with respect to the number of cycles in the ALD of Mn in each of the SiCOH layer and the Cu layer. In FIG. 12, ● indicates an example wherein the Cu layer was formed at 130 degrees C., ▲ indicates an example wherein the Cu layer was formed at 230 degrees C., ○ indicates an example wherein the SiCOH layer was formed at 130 degrees C., and Δ indicates an example wherein the SiCOH layer was formed at 230 degrees C. These results show that the formation of the thin layer of manganese oxide by the ALD caused deposition of manganese oxide on the Cu layer, thereby increasing the thickness thereof with increasing number of cycles, whereas only a small amount of manganese oxide was deposited on the insulation film even in the case of increasing the number of cycles. Accordingly, it can be confirmed that manganese oxide is highly selectively deposited on the insulation film and the Cu layer.

Example 2

Interconnect resistance and leakage current were examined upon formation of the thin layer of manganese oxide on the copper interconnects by the method according to the embodiment of the present disclosure. Each of line width and pitch of interconnects formed on a wafer for evaluation was set to 60 nm and a circuit length was set to 3 cm. Circuit structures obtained by setting the numbers of the ALD cycle to 20 and 40 cycles upon formation of the thin layer of manganese oxide were denoted by Example 2-1 and Example 2-2, respectively. Further, the circuit structure of Comparative Example 2 was obtained by the same manner as in Example 2-1 except that annealing was not performed and the layer 25 of manganese oxide was not formed. In each of Examples 2-1 and 2-2 and Comparative Example 2, resistance and leakage current of the circuit were measured.

Figure 13:
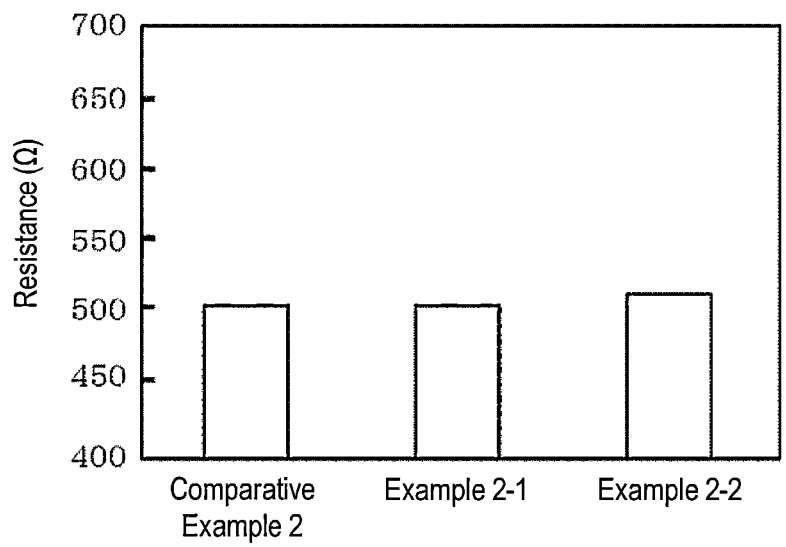
FIG. 13 is a graph depicting resistance of interconnects in each of the substrate samples.
Figure 14:
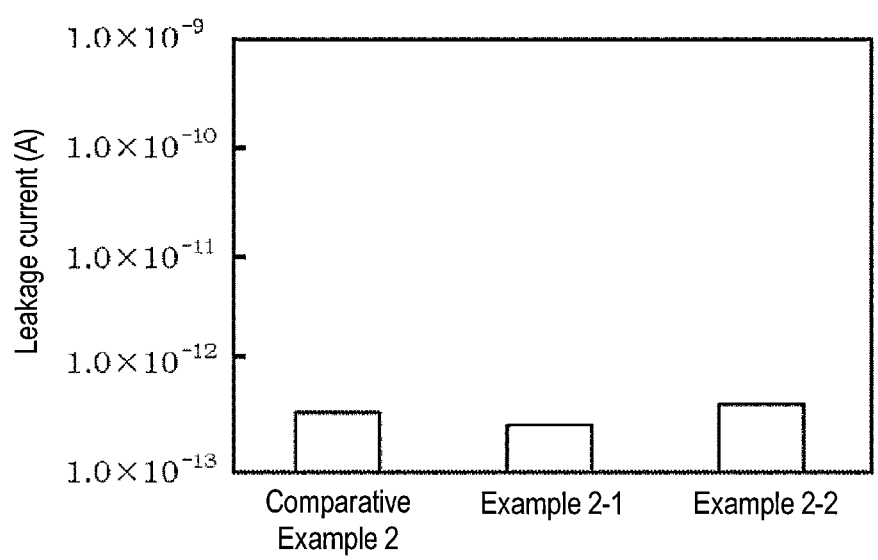
FIG. 14 is a graph depicting leakage current of interconnection circuits in each of the substrate samples.

FIGS. 13 and 14 show measurement results. From the results shown in FIGS. 13 and 14, it can be seen that the formation of the layer 25 of manganese oxide does not have negative influence on the circuit structure, such as increase in interconnect resistance or leakage current. Therefore, it is considered that, in the examples wherein the ALD of manganese was used, manganese oxide does not have high conductivity and thus had no influence on increase of leakage current, even in the case where film formation selectivity by an underlying base (copper or insulation film) was not 100%, unlike typical examples wherein CoWP and like are formed by electroless plating.

Example 3

In each substrate subjected to annealing at 300 degrees C. for 3 minutes and at 400 degrees C. for 20 minutes after polishing evaluation chips through the CMP, a remaining amount of the BTA attached to the surface of the substrate was measured. The remaining amount of the BTA attached to the surface of the substrate was measured by Time-of-Flight Secondary Ion Mass Spectroscopy.

Figure 15:
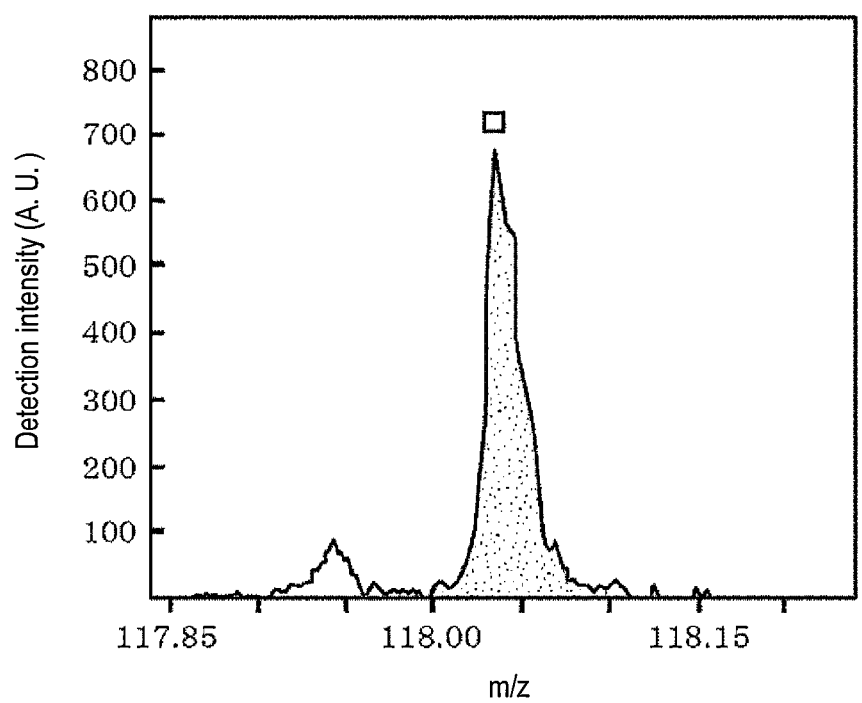
FIG. 15 is a graph depicting results of mass analysis with respect to an anti-corrosion agent on a copper surface.
Figure 16:
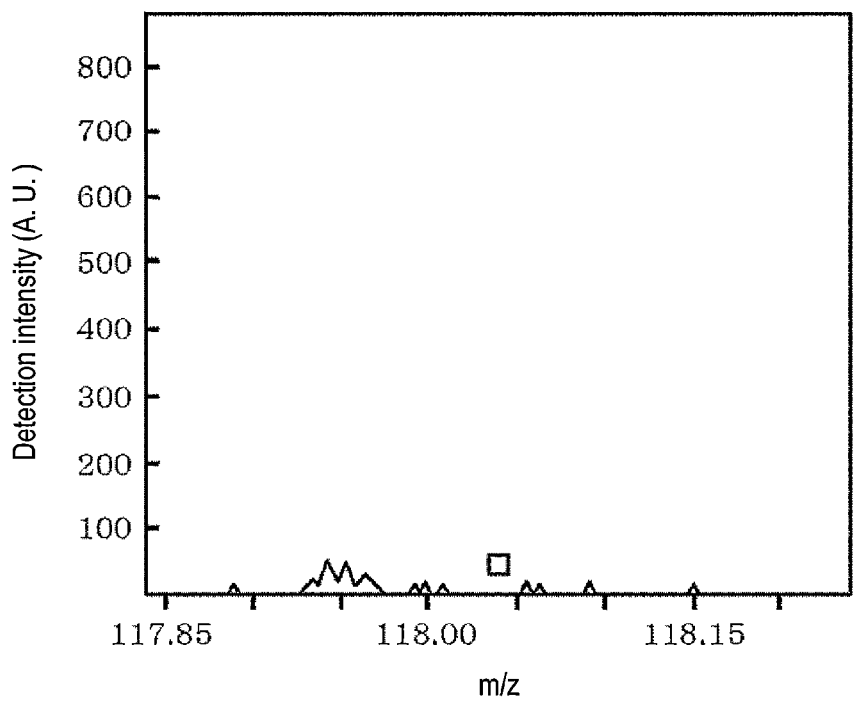
FIG. 16 is a graph depicting results of mass analysis with respect to an anti-corrosion agent on a copper surface.

FIG. 15 and FIG. 16 show measurement results, in which the horizontal axis indicates m/z (mass/charge) values and the vertical axis indicates spectrum of detection intensity. In the drawings, □ indicates spectrum of the BTA. According to these results, it can be seen that the BTA was substantially removed from the substrate subjected to annealing at 400 degrees C. for 20 minutes (FIG. 16). On the other hand, the removal of the BTA was not sufficient with respect to the substrate subjected to annealing at 300 degrees C. for 3 minutes (FIG. 15). Thus, when annealing is performed at, for example, 300 degrees C., it is necessary to perform annealing for a longer period of time.

Example 4-1

Current was supplied to a semiconductor device according to the embodiment of the present disclosure to examine time for disconnection of interconnects.

Figure 20:
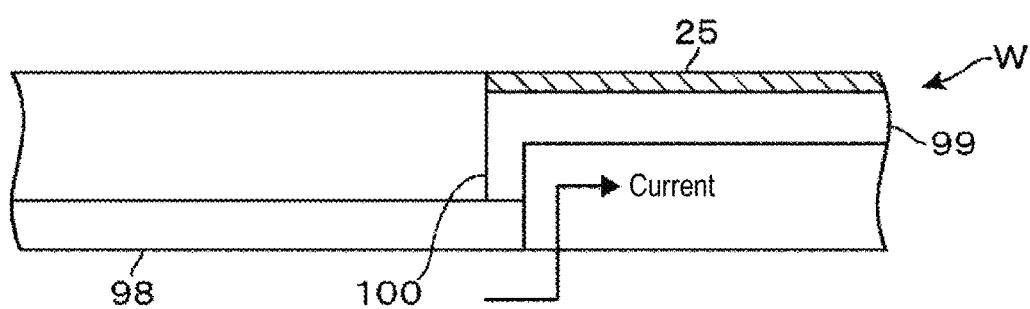
FIG. 20 is a side sectional view of an interconnect structure of a wafer according to one example of the present disclosure.

A chip for evaluation was prepared by forming 100 nm width copper interconnects 98, 99 in upper and lower layers, respectively, as shown in FIG. 20, in which the copper interconnects 98, 99 were connected to each other by an 80 nm diameter via 100 disposed therebetween. The CMP was performed using slurries containing the BTA to remove the remaining Cu of the copper interconnect 99 in the upper layer, followed by annealing at 400 degrees C. for 20 minutes to remove a thin layer of the BTA from the chip. Then, the chip was exposed in the air for 4 days and subjected to 20 cycles of the ALD of Mn to form a layer 25 of manganese oxide on the surface of the copper interconnect 99.

Example 4-2

A chip for evaluation was processed in the same manner as in Example 4-1 except that the chip was not exposed in the air after removal of BTA.

Comparative Example 4-1

A chip for evaluation subjected to the CMP was processed in the same manner as in Example 4-1 except that the chip was not exposed in the air for 4 days without annealing and the thin layer of manganese oxide was not formed thereon.

Comparative Example 4-2

A chip for evaluation was processed by the same manner as in Example 4-1 except that the thin layer of manganese oxide was not formed thereon.

Results and Consideration

With respect to each of the chips prepared in Examples 4-1 and 4-2 and Comparative Examples 4-1 and 4-2, time for disconnection of the copper interconnect was measured by flowing current at a current density of 20 mA/cm$^2$ at 300 degrees C. from the copper interconnect 89 in the lower layer to the copper interconnect 99 in the upper layer through the via 100. For each of Examples 4-1 and 4-2 and Comparative Examples 4-1 and 4-2, testing was performed with respect to four samples.

Figure 17:
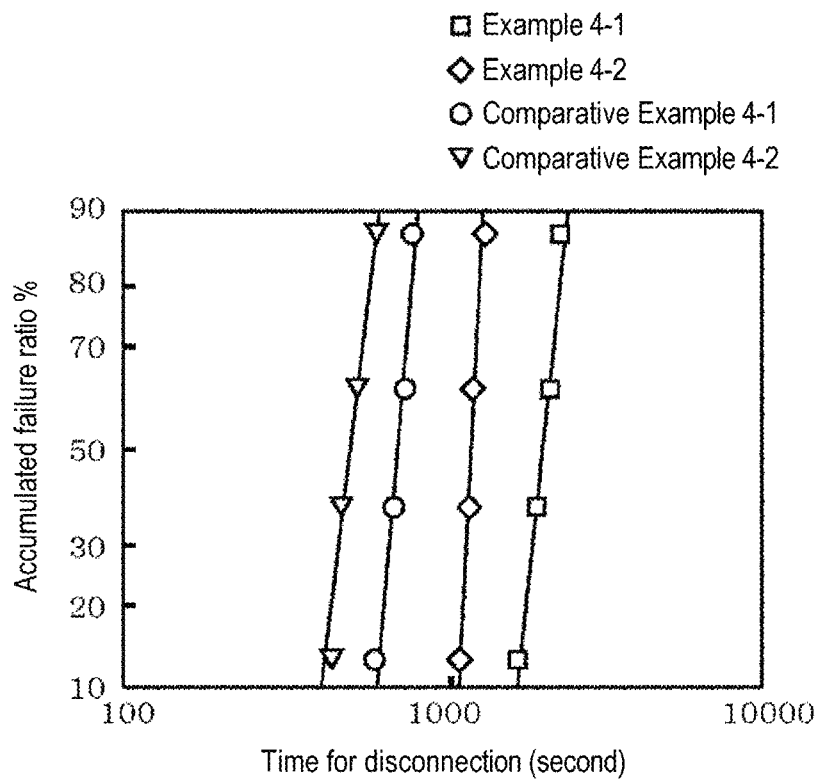
FIG. 17 is a graph depicting a relationship between time for disconnection and occurrence rate in each of the substrate samples.
Figure 18:
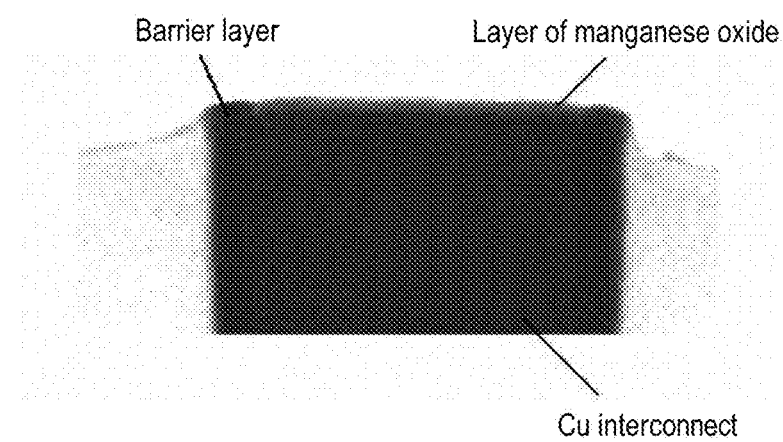
FIG. 18 is a TEM picture of a side section after film formation by the method of fabricating a semiconductor device according to one example of the present disclosure.
Figure 19:
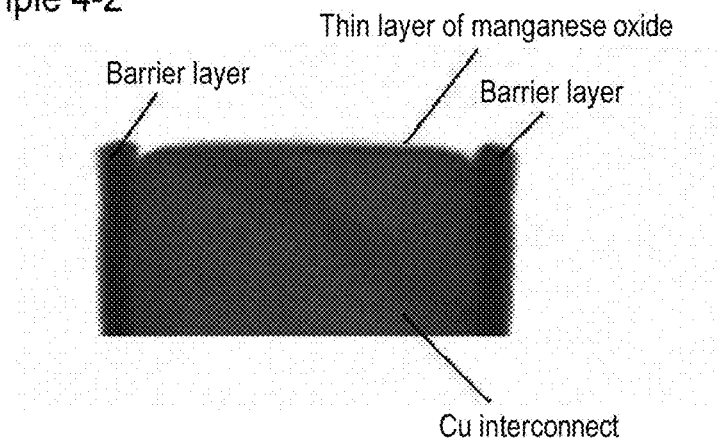
FIG. 19 is a TEM picture of a side section after film formation by the method of fabricating a semiconductor device according to another example of the present disclosure.

FIG. 17 is a graph depicting measurement results and shows a relationship between time and a ratio (accumulated failure ratio) of the number of samples suffering from interconnect disconnection to the total number of samples in each of Examples 4-1 and 4-2 and Comparative Examples 4-1 and 4-2. In addition, FIGS. 18 and 19 show transmission electron microscopy (TEM) pictures of side sections of the layer 25 of manganese oxide in Examples 4-1 and 4-2, respectively. FIG. 20 is a side sectional view of copper interconnects and FIGS. 21 and 22 respectively show pictures of the copper interconnects when current flows therein in Example 4-1 and Comparative Example 4-1.

Figure 21:
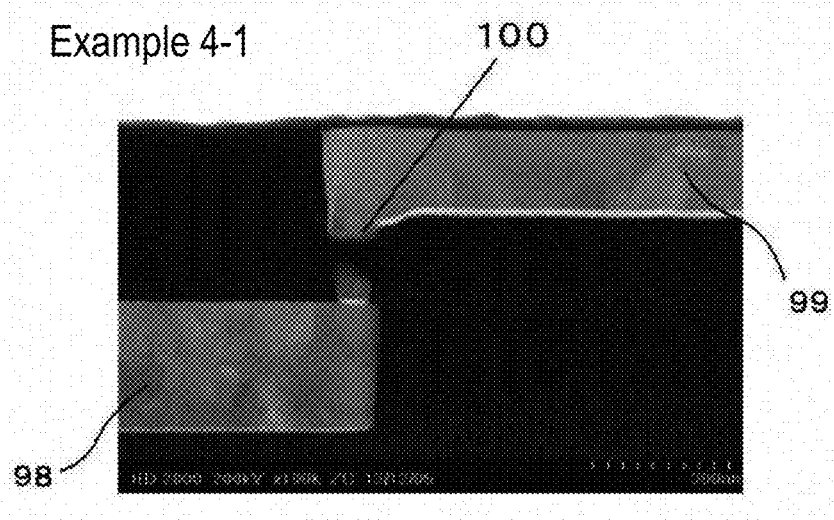
FIG. 21 is a picture of a side section after film formation by the method of fabricating a semiconductor device according to one example of the present disclosure.
Figure 22:
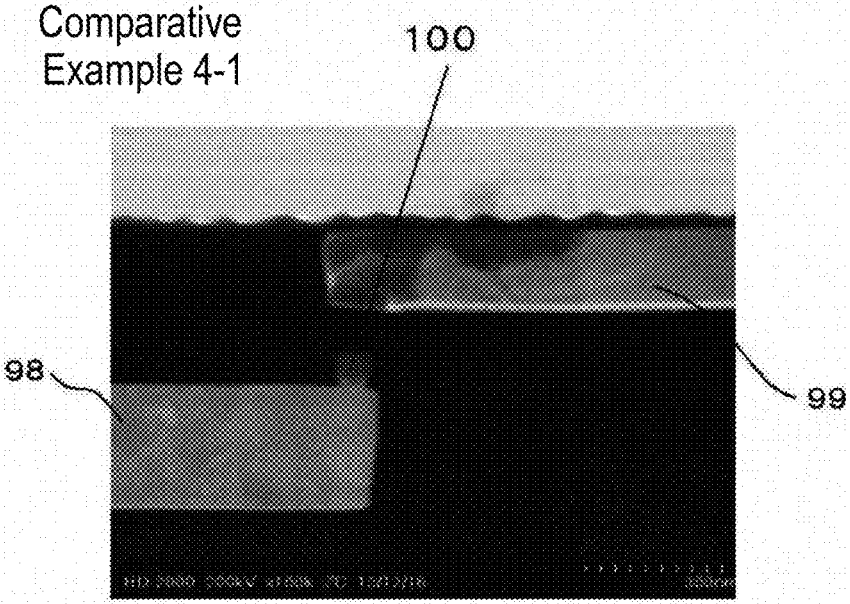
FIG. 22 is a picture of a side section after film formation by the method of fabricating a semiconductor device according to a comparative example.

According to the results, Example 4-1 had a longer time for disconnection than Example 4-2 and Comparative Examples 4-1 and 4-2. In addition, Example 4-2 had a longer time for disconnection than Comparative Examples 4-1 and 4-2. Further, as shown in FIG. 19, the layer 25 of manganese oxide was thinly deposited in Example 4-2, whereas a relatively thick layer 25 of manganese oxide was formed in Example 4-1, as shown in FIG. 18. Further, as shown in FIG. 22, the copper interconnect 99 in the upper layer suffered from loss of copper due to electron migration in Comparative Example 4-1, whereas there was no electron migration of copper in Example 4-1, as shown in FIG. 21.

Accordingly, it can be concluded that, although the copper interconnect 99 is likely to suffer from disconnection upon removal of the BTA from the surface thereof, formation of the layer 25 of manganese oxide thereon makes it difficult to disconnect the copper interconnect. Further, it can be concluded that, when the surface of the copper interconnect is oxidized by exposure in the air before formation of the layer of manganese oxide, the layer 25 of manganese oxide can be thickly formed thereon, thereby making it more difficult to disconnect the copper interconnect.

As such, the method of fabricating a semiconductor device according to the embodiments of the present disclosure can suppress electron migration in the copper interconnect 14.

According to the present disclosure in some embodiments, a substrate having a copper interconnect exposed on an insulation film by polishing is subjected to heat treatment to remove a layer of an anti-corrosion agent contained in slurries used upon polishing from the surface of the copper interconnect, followed by oxidation of the surface of the copper interconnect. Then, a layer of manganese oxide is formed on the surface of the copper interconnect by supplying process gas towards the surface of the copper interconnect. Accordingly, as described above in the examples, the layer of manganese oxide can be securely formed on the surface of the copper interconnect, thereby suppressing electron migration of copper from the copper interconnect. Furthermore, when a barrier layer is formed thereon, the layer of manganese oxide acts as a close contact layer between the barrier layer and the copper interconnect, thereby providing high reliability of interconnects.

While certain embodiments have been described, these embodiments have been presented by way of example only, and are not intended to limit the scope of the disclosure. Indeed, the embodiments described herein may be embodied in a variety of other forms. Furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A method of fabricating a semiconductor device including a substrate having a copper interconnect exposed on a surface of an insulation film, wherein a layer of an anti-corrosion agent composed of organic material is formed on the surface of the copper interconnect, the method comprising:

removing the layer of the anti-corrosion agent by heating the substrate;

forming a thin layer including manganese oxide on the surface of the copper interconnect by supplying a gas containing an organic compound of manganese to the substrate; and oxidizing the surface of the copper interconnect while forming the thin layer including manganese oxide, wherein oxidizing the surface of the copper interconnect while forming the thin layer including manganese oxide, is performed by supplying oxidizing gas to the substrate to oxidize the organic compound of manganese.

2. A method of fabricating a semiconductor device including a substrate having a copper interconnect exposed on a surface of an insulation film, wherein a layer of an anti-corrosion agent composed of organic material is formed on the surface of the copper interconnect, the method comprising:

removing the layer of the anti-corrosion agent by heating the substrate;

forming a thin layer including manganese oxide on the surface of the copper interconnect by supplying a gas containing an organic compound of manganese to the substrate; and oxidizing the surface of the copper interconnect after removing the layer of the anti-corrosion agent and before forming the thin layer including manganese oxide, wherein oxidizing the surface of the copper interconnect before forming the thin layer including manganese oxide, is oxidation by an air.

3. A method of fabricating a semiconductor device including a substrate having a copper interconnect exposed on a surface of an insulation film, wherein a layer of an anti-corrosion agent composed of organic material is formed on the surface of the copper interconnect, the method comprising:

removing the layer of the anti-corrosion agent by heating the substrate;

forming a thin layer including manganese oxide on the surface of the copper interconnect by supplying a gas containing an organic compound of manganese to the substrate; and oxidizing the surface of the copper interconnect after removing the layer of the anti-corrosion agent and before forming the thin layer including manganese oxide, wherein oxidizing the surface of the copper interconnect before forming the thin layer including manganese oxide, is performed by transporting the substrate into a process container and supplying gas containing an oxidizing agent to the substrate.

4. A method of fabricating a semiconductor device including a substrate having a copper interconnect exposed on a surface of an insulation film, wherein a layer of an anti-corrosion agent composed of organic material is formed on the surface of the copper interconnect, the method comprising:

removing the layer of the anti-corrosion agent by heating the substrate; and forming a thin layer including manganese oxide on the surface of the copper interconnect by supplying a gas containing an organic compound of manganese to the substrate, wherein forming the thin layer including manganese oxide alternately implements the following processes plural times: adsorbing the gas containing the organic compound of manganese to the substrate under a vacuum atmosphere; and supplying an oxidizing gas to the substrate.

5. A method of fabricating a semiconductor device including a substrate having a copper interconnect exposed on a surface of an insulation film, wherein a layer of an anti-corrosion agent composed of organic material is formed on the surface of the copper interconnect, the method comprising:

removing the layer of the anti-corrosion agent by heating the substrate;

forming a thin layer including manganese oxide on the surface of the copper interconnect by supplying a gas containing an organic compound of manganese to the substrate; and forming a barrier layer on the surface of the substrate after forming the thin layer including manganese oxide on the surface of the copper interconnect, wherein the barrier layer prevents a copper from diffusing into the insulation film and the barrier layer includes at least one of silicon, carbon, and nitrogen.

* * * * *